United States Patent [19]

Gersbach et al.

[11] Patent Number: 5,391,935
[45] Date of Patent: Feb. 21, 1995

[54] ASSERTIVE LATCHING FLIP-FLOP

[75] Inventors: John E. Gersbach, Burlington, Vt.; Paul W. Chung, San Jose, Calif.

[73] Assignee: International Business Machines Corporation, Armonk, N.Y.

[21] Appl. No.: 96,102

[22] Filed: Jul. 22, 1993

[51] Int. Cl.⁶ .......................................... H03K 3/29
[52] U.S. Cl. ................................ 327/198; 327/215; 327/223; 327/201; 327/228
[58] Field of Search ............ 307/289, 270, 571, 272.2, 307/272.3, 570, 542, 291; 328/206

[56] References Cited

U.S. PATENT DOCUMENTS

| | | | |
|---|---|---|---|
| 3,247,399 | 4/1966 | Woody | 328/206 |
| 3,307,045 | 2/1967 | Paivinen | 328/206 |
| 3,912,950 | 10/1975 | Tada | 307/289 |
| 4,088,903 | 5/1978 | Jones | 328/206 |
| 4,093,878 | 6/1978 | Paschal et al. | 307/291 |
| 4,274,017 | 5/1981 | Carter et al. | 307/291 |
| 4,309,625 | 1/1982 | Takahashi | 307/272 A |
| 4,491,745 | 1/1985 | Birch | 307/272 |
| 4,553,046 | 11/1985 | Alzati et al. | 307/289 |
| 4,560,888 | 12/1985 | Oida | 307/272 A |
| 4,591,737 | 5/1986 | Campbell | 307/291 |
| 4,622,475 | 11/1986 | Whiteley | 307/289 |
| 4,777,388 | 10/1988 | Widener | 307/272.2 |
| 4,779,009 | 10/1988 | Tsunoi et al. | 307/272.2 |
| 4,800,296 | 1/1989 | Ovens et al. | 307/291 |
| 4,825,097 | 4/1989 | Bazil et al. | 307/272.2 |
| 4,837,465 | 6/1989 | Rubinsein | 307/530 |
| 4,855,617 | 8/1989 | Ovens | 307/272.2 |
| 4,914,318 | 4/1990 | Allen | 307/272.2 |
| 4,929,850 | 5/1990 | Breuninger | 307/272.1 |
| 4,933,571 | 6/1990 | Pribyl | 307/272.1 |
| 4,939,384 | 7/1990 | Shikata et al. | 307/289 |
| 4,982,118 | 1/1991 | Lloyd | 307/480 |
| 5,049,760 | 9/1991 | Ooms | 307/272.2 |
| 5,103,417 | 4/1992 | Voorman et al. | 307/272.2 |
| 5,140,179 | 8/1992 | Takano | 307/289 |
| 5,194,862 | 3/1993 | Edwards | 341/20 |

FOREIGN PATENT DOCUMENTS 0164621 12/1981 Japan .................. 328/206

OTHER PUBLICATIONS

Electronic Circuits Discrete and Integrated by Donald L. Schilling (Third edition) (pp. 396–397).

*Primary Examiner*—Timothy P. Callahan
*Assistant Examiner*—T. Lam
*Attorney, Agent, or Firm*—Calfee Halter & Griswold

[57] ABSTRACT

An assertive latching flip-flop circuit is provided which prevents the occurrence of metastable outputs. The circuit comprises a single flip-flop which is comprised of standard switching transistors which are switched by a clocking mechanism having no additionally introduced delay. The circuit includes an imbalancing element which is coupled to a latching portion of the circuit. The latching portion of the circuit comprises a pair of cross-coupled transistors, in current mode embodiments of the invention, or a pair of cross-coupled inverters, in voltage mode embodiments of the invention. The imbalancing element introduces an electrical disturbance on the input line to one of the latching transistors or inverters. The imbalancing element is a capacitor in voltage mode embodiments of the invention and an additional transistor in current mode embodiments.

10 Claims, 2 Drawing Sheets

ASSERTIVE LATCHING FLIP-FLOP

TECHNICAL FIELD

The present invention relates generally to latching flip-flop circuits and more particularly to a flip-flop circuit having a mechanism for preventing the occurrence of a metastable output state.

BACKGROUND OF THE INVENTION

Bistable latches, such as flip-flops, are capable of assuming either of two stable binary output states. The state of the output depends on the states of a data input and a clock signal. Latching flip-flops used in asynchronous systems, wherein a clock signal and a data input signal are switched asynchronously, are typically subject to a third, or metastable, output state. A metastable output may occur if the data input signal is undergoing a transition in its logic state simultaneously with an active edge of the clock signal. In such a case, the output of the flip-flop may latch at an unstable or metastable state somewhere between a logical high state and a logical low state. Such an invalid logic level cannot be interpreted by subsequent logic stages receiving the output signal from the flip-flop, resulting in system errors.

Typically, the metastable state will resolve itself over time as noise in the system stabilizes the output of the flip-flop by driving the output to either a high or low logical state. If noise does not resolve the metastability problem, however, the output of the flip-flop may be hung in an uncertain logical state until the next active clock cycle occurs. Often, the delay associated with either waiting for the output of the flip-flop to stabilize itself or waiting for the next active clock cycle is sufficiently long to cause subsequent logic circuitry to fail.

A known manner of correcting the metastability problem of flip-flops in asynchronous systems is to arrange two separate flip-flops in a cascaded configuration. U.S. Pat. No. 4,929,850 to Breuninger, for example, discloses two D-type flip-flops which are separately driven by clock pulses which are separated in time by a sufficient duration to nearly negate the possibility of the first latch being in its metastable state when the second latch is clocked. The output of the first flip-flop is permitted to stabilize before data is clocked into the second flip-flop.

U.S. Pat. No. 4,800,296 to Ovens, et al. discloses a metastable resistant flip-flop circuit including a single emitter transistor and a dual emitter transistor. During a metastable condition, each of the transistors conducts current. The second emitter on the dual emitter transistor, however, conducts additional current after a delay provided by a second clock, thereby upsetting the metastable condition of the circuit by drawing sufficient additional current to turn the single emitter transistor off.

Optimal design of flip-flop circuits requires minimal circuitry and minimum of additionally introduced delays for the purpose of eliminating metastability problems. Accordingly, it is an object of the present invention to provide a single flip-flop with improved metastability characteristics, comprising standard electrical components, and having no additional timing delays introduced therein by delayed clocking signals.

SUMMARY OF THE INVENTION

An assertive latching flip-flop having improved metastability characteristics is provided. The flip-flop receives asynchronous data and clock signals to provide a data output signal. The circuit utilizes an imbalancing component, such as an additional transistor or capacitor, to introduce an electrical disturbance into the circuit so as to prevent the occurrence of a metastable output. The flip-flop circuit may be implemented in either current mode or voltage mode embodiments, using standard components arranged in a relatively simple circuit.

In the current mode embodiment of the invention, a pair of output transistors are cross-coupled to form a latch for the flip-flop. An additional transistor incorporated into the circuit has its collector output connected to the input of one of the cross-coupled transistors. The emitter of the additional transistor is coupled to an external current source. The transistor output introduces an electrical disturbance into the circuit which prevents the data output from attaining a metastable state. The transistor conducts current only during the clock transient, which is the time at which metastability problems are likely to occur. Prior to and after the transient the transistor conducts no current and is effectively removed from the circuit.

In the voltage mode embodiment of the invention, a pair of output inverters are cross-coupled to form a latch for the flip-flop. An imbalancing capacitor incorporated into the circuit has one end coupled to a clocking signal and the other end coupled to the input of one of the cross-coupled inverters. The capacitor output introduces an electrical disturbance into the circuit which prevents the data output from attaining a metastable state.

DETAILED DESCRIPTION OF THE PREFERRED EMBODIMENT

Figure 1:
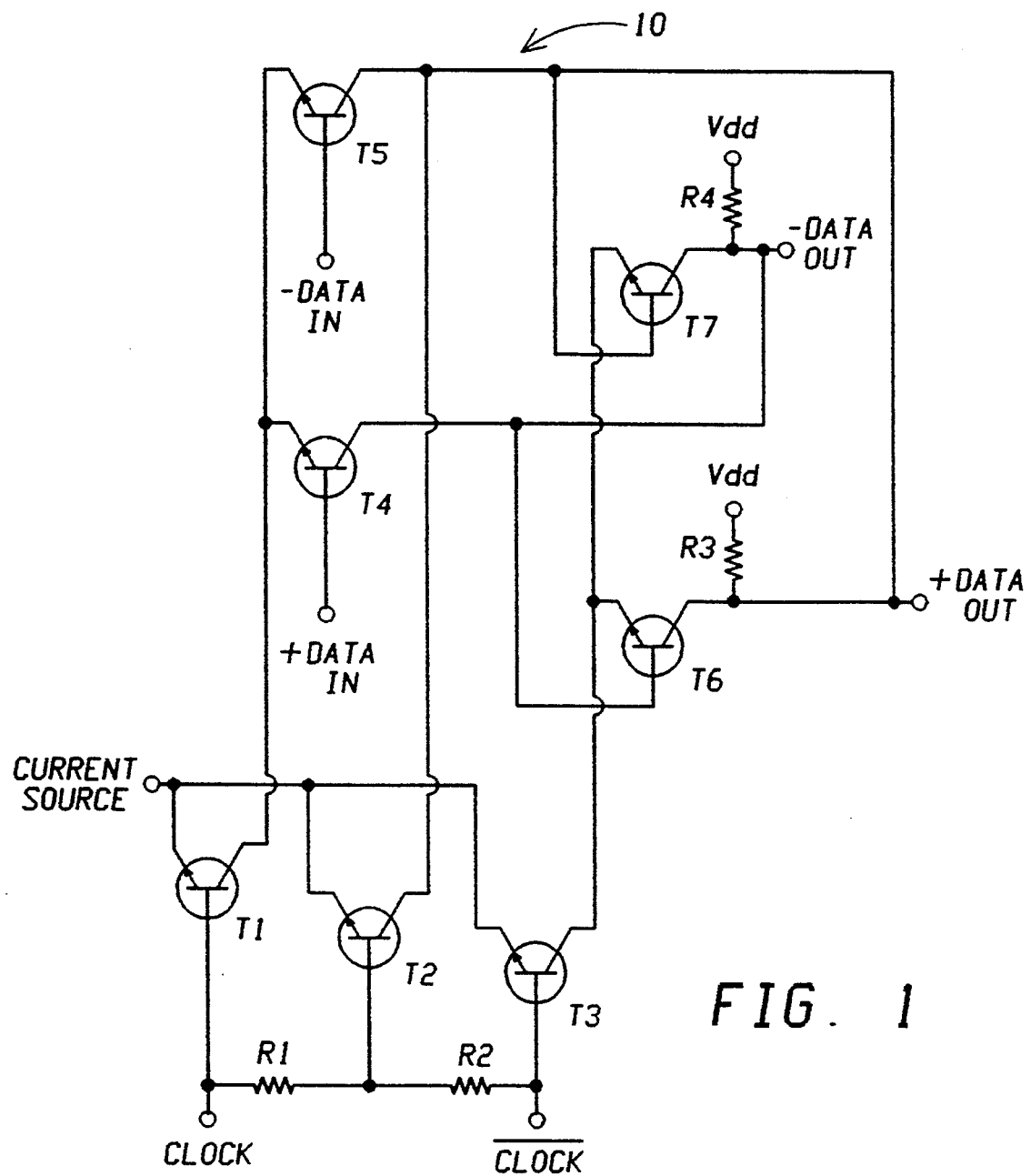
FIG. 1 is a schematic of a current mode embodiment of an assertive latching flip-flop constructed according to the present invention.

FIG. 1 is a schematic diagram of a current mode embodiment of an assertive latching flip-flop circuit 10 constructed according to the principles of the present invention. Circuit 10 shows a polarity hold-type flip-flop, although the present invention may be implemented in any data latching circuit which is subject to metastability problems, such as other types of flip-flops, registers, or latches. The circuit 10 comprises a pair of clock driven transistors T1 and T3, a pair of data input transistors T4 and T5, a pair of output transistors T6 and T7, a pair of current-routing resistors R1 and R2, a pair of pull-up resistors R3 and R4, and an imbalancing transistor T2. These individual components are electrically interconnected by conductive paths as shown in the schematic diagram of FIG. 1. In the preferred embodiment, transistors T1-T7 are standard npn-type bipolar switching transistors.

The operation of circuit 10, absent transistor T2 and resistors R1 and R2, is the same as that of a standard polarity hold-type flip-flop. An external current source of approximately one milliamp is coupled to the emitters of both T1 and T3. The bases of transistors T1 and T3 are driven, respectively, by a noninverted clock signal (CLOCK) and an inverted clock signal ($\overline{\text{CLOCK}}$). When the noninverted CLOCK signal is active (high), and the inverted $\overline{\text{CLOCK}}$ signal is inactive (low), transistor T1 is turned on and transistor T3 is turned off. T1 conducts the current provided by the external current source, from its emitter to its collector, and on to the emitters of input transistors T4 and T5, thereby enabling operation of these transistors. T3 remains off and thus conducts no portion of the current provided by the external current source.

The data input signal to the flip-flop circuit 10 of FIG. 1 is a differential input signal which is bifurcated or separated into an inverted input signal −Data In, applied to the base of transistor T5, and a noninverted input signal +Data In, applied to the base of transistor T4. This differential input signal is switched asynchronously with respect to the noninverted CLOCK and inverted $\overline{\text{CLOCK}}$ signals. The collector of transistor T4 directly drives a −Data Out circuit output, and the collector of transistor T5 directly drives a +Data Out circuit output.

Accordingly, when the noninverted CLOCK signal is active (high), the flip-flop circuit operates as a simple current switch wherein transistor T1 applies current to the emitters of transistors T4 and T5, and transistors T6 and T7 are effectively cut out of the circuit. The +Data Out signal follows the +Data In signal, and the −Data Out signal follows the −Data In signal, given that an equal capacitance is present on the outputs of transistors T6 and T7. A pull-up voltage $V_{dd}$ is applied to the collector of transistor T6 through pull-up resistor R3 and to the collector of transistor T7 through pull-up resistor R4. The values of R3 and R4 are on the order of 500 Ω and define the voltage swing between the minimum −Data Out signal amplitude and the maximum +Data Out signal amplitude. In one preferred embodiment of the invention, the differential voltage swing is about 1.0 volt, i.e., the minimum value of −Data Out=$V_{dd}$−0.5 VDC and the maximum value of +Data Out=$V_{dd}$.

When the noninverted CLOCK signal switches inactive (low) and the inverted $\overline{\text{CLOCK}}$ signal switched active (high), transistor T1 turns off, thereby disabling transistors T4 and T5, and transistor T3 turns on. Transistor T3 begins to conduct the current provided by the external current source, from its emitter to its collector, and on to the emitters of output transistors T6 and T7, thereby enabling these output transistors. Because transistor T1 is off it conducts no portion of the current provided by the external current source.

Output transistors T6 and T7 are arranged in a cross-coupled configuration, (i.e., the output (collector) of transistor T7 is coupled to the input (base) of transistor T6, and the output (collector) of transistor T6 is coupled to the input (base) of transistor T7). With current applied by transistor T3 to the emitters of output transistors T6 and T7, the collector outputs of these transistors are latched in their present state, irrespective of changes in the state of the +Data In and −Data In signal inputs.

Accordingly, with transistor T1 off and transistor T3 on, the +Data Out and −Data Out outputs maintain their latched state, regardless of any change in the state of the input signals +Data In and −Data In. The state of these outputs will not change until the beginning of the next clock cycle, when the noninverted CLOCK signal again goes active (high) and the inverted $\overline{\text{CLOCK}}$ signal goes inactive (low), at which time the output signals +Data Out and −Data Out will follow the state of their respective input signals +Data In and −Data In. Thus, the flip-flop output signals follow the flip-flop input signals only if the noninverted CLOCK signal is high, and remain latched in their current state regardless of changes in the input signals when the noninverted CLOCK signal is low.

Metastability is not a problem with the above-described circuit as long as the +Data In and −Data In signals change state while the noninverted CLOCK signal is either active (high) or inactive (low). However, metastability may occur if the asynchronous differential data input signal undergoes a transition simultaneously with a transition in the noninverted CLOCK signal from high to low. In such a case, it is possible at some time for the instantaneous voltage of the noninverted CLOCK signal to be nearly equal to that of the inverted $\overline{\text{CLOCK}}$ signal, and for the instantaneous voltage of −Data In to approximate that of +Data In (i.e. each of these signals is halfway through its respective transient). Under these circumstances, transistors T1 and T3–T7 will turn on. T1 and T3 will each conduct one-half of the current provided by the external current source, and T4–T7 will each conduct one-fourth of this current. Neither transistor T1 nor T3 will have the ability to completely turn the other off, as each of these transistors will only be partially conducting the current provided by the external current source. Transistors T4 and T5 will drive the +Data Out and −Data Out outputs to some intermediate voltage level between a logical high level and a logical low level. The outputs will maintain this intermediate logic level until either (i) the metastable state resolves itself over time as noise in the system stabilizes the output of the flip-flop by driving the output to either a high or low logic state; or (ii) the next active CLOCK cycle occurs.

The present invention eliminates the possibility of metastability in the above described circuit by augmenting the flip-flop circuit with resistors R1 and R2 and transistor T2, as shown in FIG. 1. The emitter of transistor T2 is coupled to the external current source. The base of transistor T2 is connected to the noninverted CLOCK signal by resistor R1 and to the inverted $\overline{\text{CLOCK}}$ signal by resistor R2. Resistors R1 and R2, each valued at a few K Ω, are configured to develop a pulse of current during the time during which noninverted CLOCK makes its transition from high to low, which is the time at which metastable operation would otherwise be expected. The required disturbance timing and amplitude can thus be generated with good control of critical parameters by this relatively simple resistor-transistor configuration.

Transistor T2 only conducts current during the CLOCK transient. Prior to and after the transient transistor T2 conducts no current and is effectively removed from the circuit 10. Because the resistance values of R1 and R2 are equal, each of transistors T1–T3 will conduct one-third of the current provided by the external current source during the CLOCK transient.

The pulse of current generated during the clock cycle transient is routed by the collector of transistor T2 to either the collector of T4 or, in the embodiment shown in FIG. 1, the collector of T5. The pulse of current provides an imbalancing function which prevents metastable operation of the flip-flop, by introducing an electrical disturbance into the feedback path of cross-coupled transistors T6 and T7. The voltage at the collector outputs of transistors T4 and T5 will not be the same, causing transistors T3 and T6 to draw more and more current, until transistor T1 is effectively shut off and the metastable condition is eliminated.

In order to reintroduce the conditions under which the flip-flop would attain a metastable state, an identical electrical disturbance would have to occur on the collector of transistor T4, to match the disturbance introduced by transistor T2. The probability of reaching the metastable state may be further minimized by generating a complex disturbance at the collector of T2 which is even more unlikely to be reproduced at the collector of transistor T4.

The following two criteria are satisfied by the design of the circuit 10 to prevent the occurrence of metastability. First, the gain around the loop formed by transistors T6 and T7 is greater than unity. Second, the CLOCK transition time must be slow relative to the delay of the feedback loop of the cross-coupled output latching transistors. This criterion ensures that the disturbance introduced by transistor T2 will not be integrated by the feedback loop, which would merely shift the point at which metastability could occur to some other point on the data input waveform. Under these conditions, the latch formed by transistors T6 and T7 might not recognize the disturbance generated by transistor T2 and the problem of metastability would remain.

Figure 2:
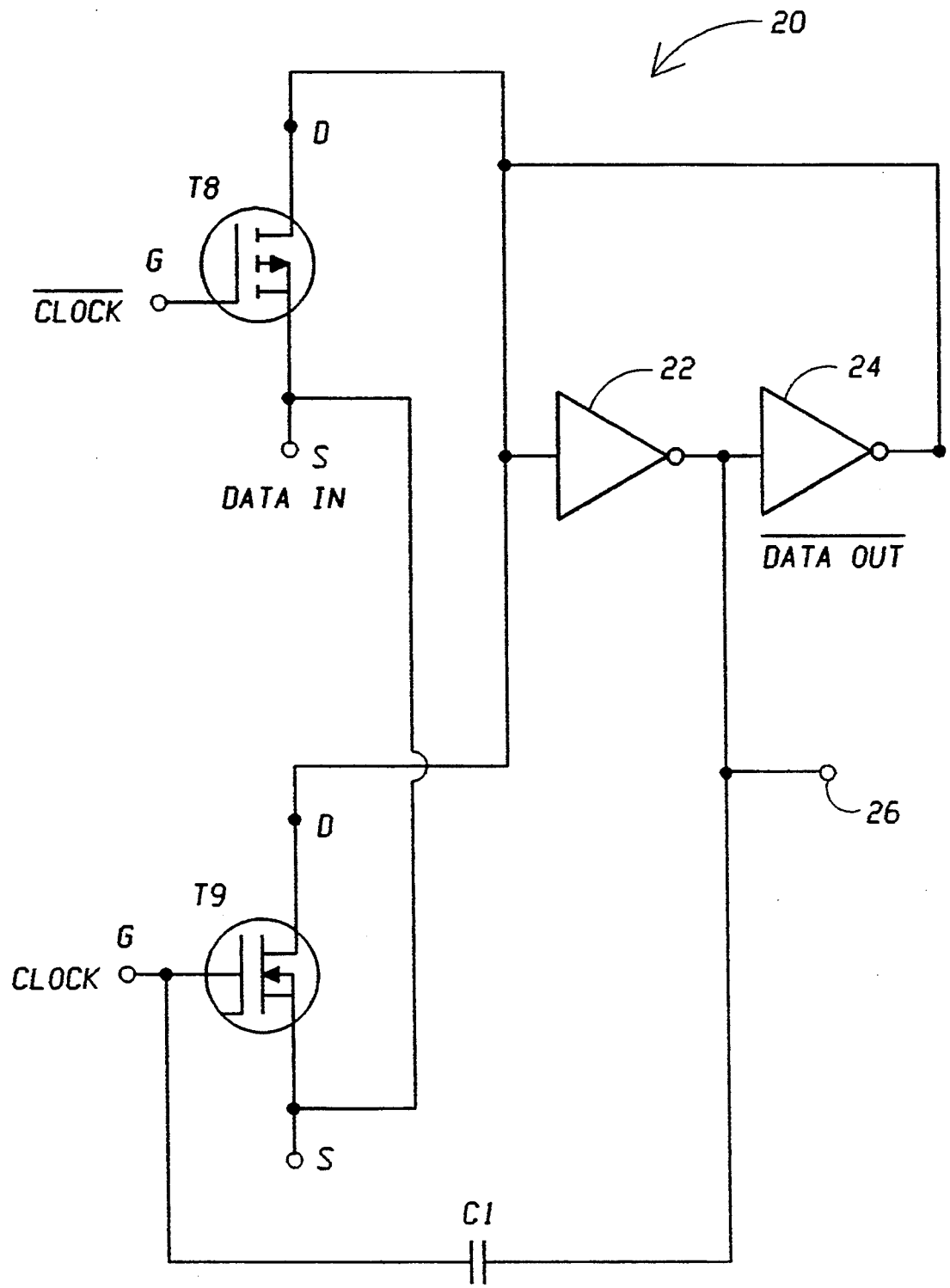
FIG. 2 is a schematic of a voltage mode embodiment of an assertive latching flip-flop constructed according to the present invention.

FIG. 2 is a schematic diagram of a voltage mode embodiment of an assertive latching flip-flop circuit 20 constructed according to the principles of the present invention. The circuit of FIG. 2 may be implemented, for example, in TTL or CMOS technology. The circuit 20 comprises a pair of switching field effect transistors (FETs) T8 and T9, a latch formed by a pair of inverters 22 and 24, and an imbalancing capacitor C1.

The theory of operation of the circuit of FIG. 2 is similar to that of FIG. 1. FETs T8 and T9, a PFET and an NFET, respectively, are arranged to function as a multiplexer, and inverters 22 and 24 are arranged in a cross-coupled configuration to form a latch. A noninverted CLOCK signal is applied to the gate of NFET T9 and an inverted $\overline{CLOCK}$ signal is applied to the gate of PFET T8. A Data In signal (not bifurcated, and asynchronous with respect to the clocking signals) is applied to the sources of FETs T8 and T9, which are tied together. The drains of FETs T8 and T9 are tied together to the input of inverter 22 and the output of inverter 24.

The output of the circuit of FIG. 2, a $\overline{DataOut}$ signal, is taken at an output 26 of the first inverter 22. When the noninverted CLOCK signal is active (high), both FETs T8 and T9 are turned on and the $\overline{DataOut}$ signal follows the Data In signal except that it is inverted. When the noninverted CLOCK signal goes inactive (low), FETS T8 and T9 are off and the $\overline{DataOut}$ signal is latched at its present state by the cross-coupled inverters 22 and 24, irrespective of changes in the Data In signal.

The circuit 20 of FIG. 2, absent capacitor C1, is subject to metastability problems during the CLOCK transient from active (high) to inactive (low). To prevent the occurrence of a metastable output 26, the circuit 20 utilizes capacitor C1 to introduce a disturbance on the input of either of cross-coupled inverters 22 or 24. As shown in FIG. 2, the capacitor C1 is coupled at one end to the gate of PFET T8 and at the other end to output 26. The capacitance value of the capacitor is on the order of 100 femto farads (f F).

As the noninverted CLOCK signal goes from high to low, the output of the latch experiences an electrical disturbance at output 26 provided by capacitor C1. The disturbance creates an imbalance in the circuit 20 which prevents the occurrence of a metastable condition on the circuit output 26.

Accordingly, the preferred embodiment of an assertive latching flip-flop has been described. With the foregoing description in mind, however, it is understood that this description is made only by way of example, and that various changes may be implemented without departing from the true spirit of the invention as hereinafter claimed.

We claim:

1. A flip-flop circuit, comprising:
   a switching portion having at least three inputs and a first data output;
   a clock input and a complementary, synchronous inverted clock input coupled to, respectively, first and second at least three inputs of said switching portion;
   at least one data input coupled to a third of said at least three inputs of said switching portion, said complementary clock inputs and said at least one data input being switched asynchronously with respect to each other;
   a latching portion coupled to said first data output of said switching portion for providing at least a second data output, said latching portion comprising a pair of transistors arranged in cross-coupled configuration such that an input of a first transistor is coupled to said first data output of said switching portion and to an output of a second transistor by a first conductive path and an input of said second transistor is coupled to an output of said first transistor by a second conductive path; and
   a third transistor coupled to one of said first or second conductive paths wherein a base of said third transistor is coupled to said clock input by a first resistor and coupled to said inverted clock input by a second resistor, and an emitter of said third transistor is coupled to an external current source, for preventing said first and second data outputs from assuming a metastable state.

2. The circuit of claim 1, wherein said switching portion of said circuit comprises a plurality of interconnected switching transistors.

3. The circuit of claim 1, wherein said first and second data outputs comprise a pair of data outputs of opposite polarity and said at least one data input comprises a pair of data inputs of opposite polarity.

4. A flip-flop circuit, comprising:
   a switching portion having a plurality of inputs and a first data output;
   at least one clock input coupled to one of said plurality of inputs of said switching portion;
   at least one data input coupled to another one of said plurality of inputs of said switching portion, said at least one clock input and said at least one data input being switched asynchronously with respect to each other;
   a latching portion coupled to said first data output of said switching portion for providing at least a second data output, said latching portion comprising a pair of inverters arranged in cross-coupled configuration such that an input of a first inverter is directly coupled to said first data output of said switching portion and to an output of a second inverter by a first conductive path and an input of said second inverter is directly coupled to an output of said first inverter by a second conductive path; and a capacitor coupled at one end to one of said first or second conductive paths, and at another end to the clock input of said plurality of inputs of said switching portion, for preventing said data output from assuming a metastable state.

5. The circuit of claim 4, wherein said at least one clock input comprises a noninverted clock input and an inverted clock input.

6. The circuit of claim 5, wherein said inverted clock input and said noninverted clock input are complements of each other and are not separated by a time delay.

7. The circuit of claim 5, wherein said capacitor is coupled at one end to either said inverted or noninverted clock input and at the other end to the output of said first inverter.

8. The circuit of claim 5, wherein said switching portion comprises first and second field effect transistors.

9. A flip-flop circuit, comprising:

a switching portion having first through fourth inputs and first and second data outputs of opposite polarity;

a noninverted clock input and an inverted clock input coupled, respectively, to said first and second inputs of said switching portion;

a pair of data inputs of opposite polarity coupled, respectively, to said third and fourth inputs of said switching portion, said clock inputs and said data inputs being switched asynchronously with respect to each other;

a latching portion coupled to said first and second data outputs of said switching portion, said latching portion comprising first and second transistors arranged in cross-coupled configuration such that an input of said first transistor is coupled to said first data output of said switching portion and to an output of said second transistor by a first conductive path, and an input of said second transistor is coupled to said second data output of said switching portion and to an output of said first transistor by a second conductive path; and an imbalancing transistor coupled to one of said first or second conductive paths for preventing said data output from assuming a metastable state, wherein a base of said imbalancing transistor is coupled to said noninverted clock input by a first resistor and coupled to said inverted clock input by a second resistor, and an emitter of said imbalancing transistor element is coupled to an external current source.

10. A flip-flop circuit, comprising:

a switching portion comprising first and second field effect transistors each providing a gate input, a source input, and a drain output, said gate inputs of said first and second field effect transistors coupled, respectively, to an inverted clock input and a noninverted clock input, both of said source inputs of said first and second field effect transistors coupled to a data input, said clock inputs and said data input being switched asynchronously with respect to each other, said drains of said first and second field effect transistors tied together to provide a first data output;

a latching portion coupled to said first data output of said switching portion for providing at least a second data output, said latching portion comprising first and second inverters arranged in cross-coupled configuration such that an input said first inverter is coupled to said first data output of said switching portion and to an output said second inverter by a first conductive path and an input of said second inverter is coupled to an output of said first inverter by a second conductive path; and a capacitor coupled at one end to one of said first or second conductive paths, and at another end to said gate input of said first field effect transistor for preventing said data output from assuming a metastable state.

* * * * *

UNITED STATES PATENT AND TRADEMARK OFFICE
CERTIFICATE OF CORRECTION

PATENT NO. : 5,391,935
DATED : Feb. 21, 1995
INVENTOR(S) : Gersbach, et al.

It is certified that error appears in the above-indentified patent and that said Letters Patent is hereby corrected as shown below:

In col. 6, line 22, after "second", insert -- of said--.

Signed and Sealed this

Second Day of May, 1995

Attest:

BRUCE LEHMAN

*Attesting Officer*　　　*Commissioner of Patents and Trademarks*